United States Patent [19]

Toyomura et al.

[11] 4,310,810
[45] Jan. 12, 1982

[54] MODULATOR SYSTEMS

[75] Inventors: Yasuhiro Toyomura; Hitoshi Fujisaki; Hideo Onodera, all of Kodaira, Japan

[73] Assignee: Hitachi Denshi K.K., Tokyo, Japan

[21] Appl. No.: 76,241

[22] Filed: Sep. 18, 1979

[30] Foreign Application Priority Data

Sep. 22, 1978 [JP] Japan ................... 53-116017

[51] Int. Cl.³ .............................................. H03C 1/00
[52] U.S. Cl. ..................................... 332/31 T; 332/44
[58] Field of Search ............... 332/31 T, 31 R, 41–44; 307/254, 355

[56] References Cited

U.S. PATENT DOCUMENTS 3,852,688 12/1974 Takeda ............................. 332/31 T
3,974,460 8/1976 Hongu ............................. 332/31 T

FOREIGN PATENT DOCUMENTS 52-19945 2/1977 Japan ................................. 332/31 T
1160603 8/1969 United Kingdom ............. 332/31 T Primary Examiner—David K. Moore
Attorney, Agent, or Firm—Blakely, Sokoloff, Taylor & Zafman

[57] ABSTRACT

The modulator system comprises emitter follower type first and second transistor pairs with their emitter electrodes commonly connected, and an emitter follower type third transistor pair with their emitter electrodes commonly connected. Clamped modulation signals having opposite polarities are supplied to the base electrodes of the first transistors of the first and second transistor pairs, whereas signals to be modulated and having opposite polarities are supplied to the base electrodes of the second transistors of the first and second transistor pairs. The base electrodes of the first and second transistors of the third transistor pair are connected to the commonly connected emitter electrodes of the first and second transistor pairs, thereby producing a modulated output signal from the commonly connected emitter electrodes of the third transistor pair.

1 Claim, 4 Drawing Figures (a)

(b)

(c)

(d)

MODULATOR SYSTEMS

BACKGROUND OF THE INVENTION

This invention relates to a modulator system having a wide dynamic range and more particularly to a modulator system operable with a low source voltage.

One example of a prior art modulator system is illustrated in FIG. 1 and comprises an input terminal $IN_1$ supplied with a signal to be modulated, another input terminal $IN_2$ supplied with a modulation signal and an output terminal OUT for deriving out a modulated output signal. The modulator circuit further comprises transistor pairs $Q_1$, $Q_2$ and $Q_3$, $Q_4$, the emitter electrodes of respective pairs being commonly connected, driving transistor pair $Q_5$ and $Q_6$ respectively driving transistor pairs $Q_1$, $Q_2$ and $Q_3$, $Q_4$, and another transistor pair $Q_7$ and $Q_8$ constituting a constant current source for transistor pairs $Q_5$ and $Q_6$.

The collector electrode of transistor $Q_1$ is connected to a source of supply $V_{cc}$ via a resistor $R_1$, while the base electrode of the transistor $Q_1$ is connected to the input terminal $IN_1$. The collector electrode of transistor $Q_2$ is connected to the output terminal OUT, whereas the base electrode is connected to the base electrode of transistor $Q_3$, these base electrodes being commonly connected to a source of bias voltage $E_1$. The collector electrode of transistor $Q_3$ is connected directly to the collector electrode of transistor $Q_1$, whereas the collector electrode of transistor $Q_4$ is connected to the output terminal OUT and to the source $V_{cc}$ via a resistor $R_2$. The base electrode of transistor $Q_4$ is connected to the input terminal $IN_1$. The collector electrode of transistor $Q_5$ is connected to the commonly connected emitter electrodes of transistors $Q_1$ and $Q_2$, whereas the emitter electrode of transistor $Q_5$ is connected to the collector electrode of transistor $Q_7$ and to the emitter electrode of transistor $Q_6$ via common emitter resistor $R_3$, and base electrode of transistor $Q_5$ is connected to the input terminal $IN_2$. The collector electrode of transistor $Q_6$ is connected to the commonly connected emitter electrodes of transistors $Q_3$ and $Q_4$ whereas the emitter electrode of transistor $Q_6$ is connected to the collector electrode of transistor $Q_8$. The base electrode of transistor $Q_6$ is connected to a source of bias voltage $E_2$. The emitter electrodes of the transistors $Q_7$ and $Q_8$ are grounded respectively through resistors $R_4$ and $R_5$, whereas their base electrodes are commonly connected to a source of bias voltage $E_3$.

FIG. 2 shows in sections (a) to (d) wave forms useful to explain the operation of the modulator system shown in FIG. 1 wherein the waveform of a modulation signal applied to the input terminal $IN_2$ is shown in section (a), the waveform of a signal to be modulated which is applied to the input terminal $IN_1$ in section (b), the waveform of the modulated output obtainable at the resistor $R_2$ in section (c), and the wave form of the modulated output obtainable at the resistor $R_1$ in section (d), the polarities and the phases of the wave forms shown in FIG. 2 at (c) and (d) being opposite with each other.

The operation of the circuit shown in FIG. 1 will now be described with reference to FIG. 2. The modulation signal applied to the input terminal $IN_2$ and having a waveform as shown in FIG. 2 at (a) is applied to the base electrode of transistor $Q_5$ to drive the same. The transistor $Q_5$ thus driven operates in two manners, that is, (1) as a grounded emitter circuit and (2) as an emitter follower. In the former case (1), the collector output is applied to the commonly connected emitter electrodes of transistors $Q_1$ and $Q_2$ for driving the same. At this time, transistors $Q_1$ and $Q_2$ connected to cascade with transistor $Q_5$ are in a grounded base connection and operate so. In the latter case (2) wherein transistor $Q_5$ is operated in an emitter follower scheme, the emitter output signal thereof will be transmitted to transistor $Q_6$ via resistor $R_3$. Since this transistor $Q_6$ is in grounded base, the modulation signal transmitted through resistor $R_3$ becomes the collector output of the transistor $Q_6$ which drives transistors $Q_3$ and $Q_4$ with their emitter electrodes commonly connected. At this time, transistors $Q_3$ and $Q_4$ are in grounded base and operate so.

The signal to be modulated having a waveform as shown in FIG. 2 at (b) and applied to the input terminal $IN_1$ drives transistors $Q_1$ and $Q_4$. However, as shown in FIG. 1, these transistors $Q_1$ and $Q_4$ are emitter coupled with transistors $Q_2$ and $Q_3$ respectively so that transistors $Q_1$ and $Q_4$ constitute a differential amplifier. The mutual conductance gm of the differential amplifier varies depending upon the driving signal (in this case, the signal to be modulated) so that the differential amplifier will manifest switching characteristics when the driving signal exceeds a predetermined input level. For this reason, when the signal to be modulated, shown in FIG. 2 at (b), assumes a positive half cycle, transistors $Q_1$ and $Q_4$ are turned ON, while transistors $Q_2$ and $Q_3$ are turned OFF. In the same manner, when the signal to be modulated, shown in FIG. 2 at (b), assumes a negative half cycle, transistors $Q_1$ and $Q_4$ are turned OFF, whereas transistors $Q_2$ and $Q_3$ are turned ON.

Thus, when transistors $Q_1$ and $Q_3$ are alternately turned ON, an output will appear across resistor $R_1$, whereas when transistors $Q_2$ and $Q_4$ are alternately turned ON, an output will appear across the resistor $R_2$. The wave forms of the outputs are shown in sections (d) and (c) in FIG. 2, respectively. As shown, when transistor $Q_1$ or $Q_2$ is ON, the output at the output terminal OUT is such that a modulation signal which is an inversion of the modulation signal as shown in FIG. 2 at (a) is switched with the signal to be modulated shown in FIG. 2 at (b) because at this time the transistor $Q_5$ is in grounded emitter and operates so. On the other hand, when transistor $Q_3$ and $Q_4$ is ON, the output at the output terminal OUT is such that the modulation signal as shown in FIG. 2 at (a) is switched with the signal to be modulated shown in FIG. 2 at (b) because at this time transistor $Q_5$ operates in an emitter follower scheme, while the transistor $Q_6$ is in grounded base and operates so.

By repeating the operation described above, a modulated output signal is produced at the output terminal OUT.

With the modulation system, however, since three stages of transistor circuits and two resistors are connected in series between the source and the ground, there are such problems, when the source voltage is low, that the level of the input modulation signal is required to be low, thereby lowering the dynamic level and degrading the signal to noise ratio (S/N) of the modulated output signal with respect to the input signal to be modulated.

SUMMARY OF THE INVENTION

Accordingly, it is an object of this invention is to provide an improved modulator system that can solve various problems described above and can provide a wide dynamic range even with a low source voltage.

According to this invention, there is provided a modulator system comprising emitter follower type first and second transistor pairs, emitter electrodes of the transistors of each pair being commonly connected; an emitter follower type third transistor pair, emitter electrodes of the transistors of the third pair being commonly connected; means to supply clamped modulation signals having polarities opposite to each other to base electrodes of first transistors of the first and second transistor pairs; means to supply signals to be modulated and having polarities opposite to each other to base electrodes of second transistors of the first and second transistor pairs; and means for connecting base electrodes of the first and second transistors of the third transistor pair to the commonly connected emitter electrodes of the first and second transistor pairs, thereby producing a modulated output signal from the commonly connected emitter electrodes of the third transistor pair.

DESCRIPTION OF THE PREFERRED EMBODIMENTS

Figure 1:
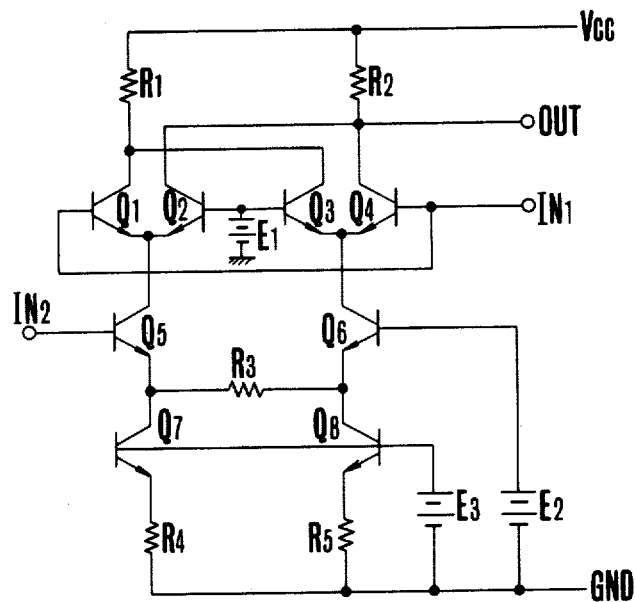
FIG. 1 is a connection diagram showing one example of a prior art modulator system.
Figure 2:
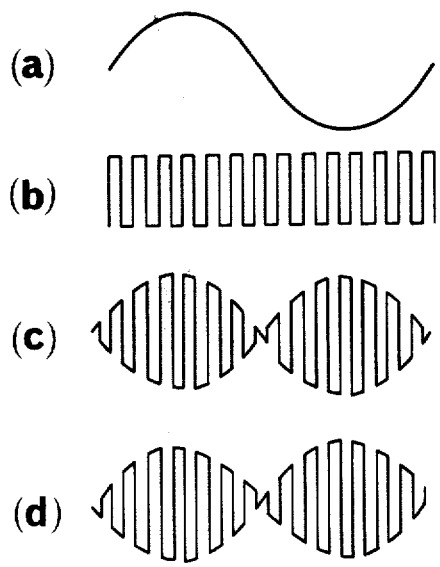
FIG. 2 illustrates in sections (a) to (d) wave forms utilized to explain the operation of the modulation system shown in FIG. 1.
Figure 3:
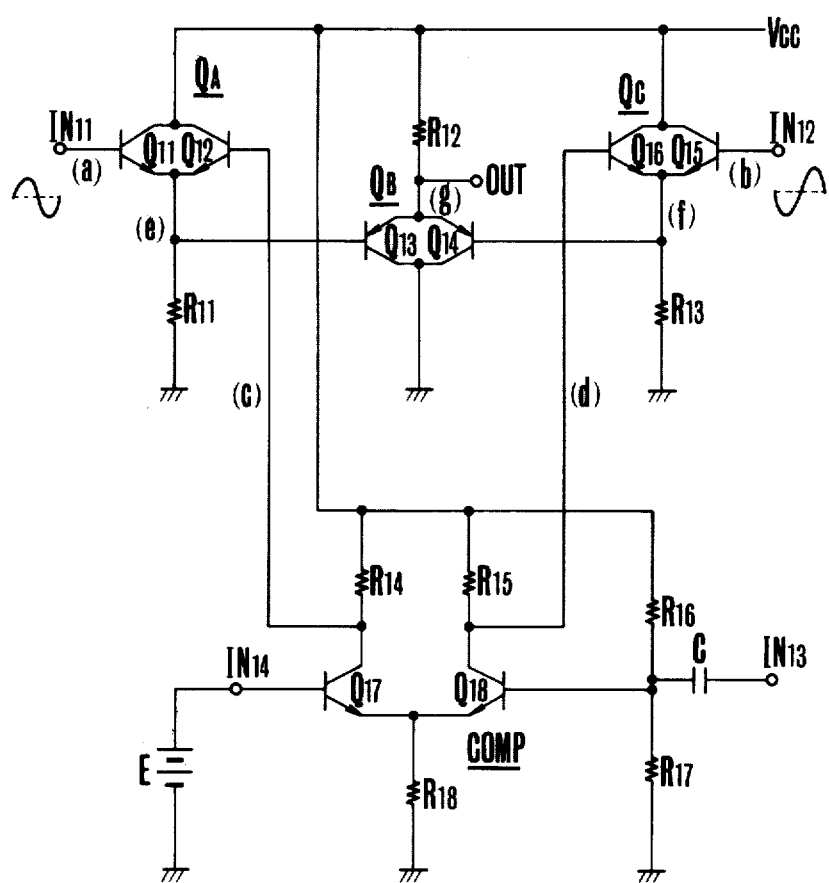
FIG. 3 is a connection diagram showing one embodiment of the modulation system according to this invention.

A preferred embodiment of the modulator system illustrated in FIG. 3 comprises an input terminal $IN_{11}$ connected to receive an input modulation signal, another input terminal $IN_{12}$ supplied with an input modulation signal having a polarity or phase opposite to that of the modulation signal applied to the input terminal $IN_{11}$, an input terminal $IN_{13}$ supplied with an input signal to be modulated, a terminal $IN_{14}$ supplied with a desired bias voltage from a source of bias voltage E, and an output terminal OUT from which a modulated output signal is derived out.

A pair of NPN type transistors $Q_{11}$ and $Q_{12}$ are provided with their emitter electrodes and collector electrodes connected together respectively, transistors $Q_{11}$ and $Q_{12}$ constituting an NPN type transistor pair $Q_A$ of the emitter follower type. Similarly, pair of PNP type transistors $Q_{13}$ and $Q_{14}$ are provided with their emitter electrodes and collector electrodes connected together respectively for constituting a PNP type transistor pair $Q_B$ of the emitter follower type. Furthermore, NPN type transistors $Q_{15}$ and $Q_{16}$ are provided with their respective emitter electrodes and collector electrodes connected together for constituting an NPN type transistor pair $Q_c$ of the emitter follower type. NPN type transistors $Q_{17}$ and $Q_{18}$ are provided with their emitter electrodes connected together to constitute a differential amplifier COMP.

The commonly connected collector electrodes of transistors $Q_{11}$ and $Q_{12}$ of the emitter follower type NPN type transistor pair $Q_A$ are connected to a source of supply $V_{cc}$ whereas their commonly connected emitter electrodes are grounded through a resistor $R_{11}$. The base electrode of transistor $Q_{11}$ is connected to the input terminal $IN_{11}$, and the base electrode of transistor $Q_{12}$ is connected to the collector electrode of transistor $Q_{17}$. The commonly connected emitter electrodes of transistors $Q_{13}$ and $Q_{14}$ of the emitter follow type PNP type transistor pair $Q_B$ are connected to the output terminal OUT and to the source $V_{cc}$ via a resistor $R_{12}$, whereas their commonly connected collector electrodes are grounded. The base electrode of the transistor $Q_{13}$ is connected to the commonly connected emitter electrodes of transistors $Q_{11}$ and $Q_{12}$, whereas the base electrode of transistor $Q_{14}$ is connected to the commonly connected emitter electrodes of transistors $Q_{15}$ and $Q_{16}$. The commonly connected collector electrodes of the transistors $Q_{15}$ and $Q_{16}$ of the emitter follower type transistor pair $Q_c$ are connected to the source $V_{cc}$, while their commonly connected emitter electrodes are connected to ground via a resistor $R_{13}$. The base electrode of transistor $Q_{15}$ is connected to the input terminal $IN_{12}$, whereas the base electrode of transistor $Q_{16}$ is connected to the collector electrode of transistor $Q_{18}$. The collector electrode of transistor $Q_{17}$ of the differential amplifier COMP is connected to the base electrode of transistor $Q_{18}$ via serially connected resistors $R_{14}$ and $R_{16}$. The commonly connected emitter electrodes of transistors $Q_{17}$ and $Q_{18}$ of the differential amplifier COMP are grounded via resistor $R_{18}$, and the base electrode of transistor $Q_{17}$ is connected to the input terminal $IN_{14}$. The collector electrode of transistor $Q_{18}$ is connected to a junction between resistors $R_{14}$ and $R_{16}$ via a resistor $R_{15}$, whereas the base electrode is connected to the input terminal $IN_{13}$ via a capacitor C and to ground through a resistor $R_{17}$. A junction common to the resistors $R_{14}$, $R_{15}$ and $R_{16}$ is connected to the source of supply $V_{cc}$.

The base electrodes of transistors $Q_{12}$ and $Q_{16}$ of the NPN type transistor pairs $Q_A$ and $Q_C$ of the emitter follower connection are respectively supplied with signals to be modulated and having opposite polarities, where as the base electrodes of the transistors $Q_{11}$ and $Q_{15}$ of the NPN type transistor pairs $Q_A$ and $Q_C$ of the emitter follower connection are supplied with clamped modulation signals having opposite polarities. The commonly connected emitter electrodes of the transistors of the NPN type transistor pairs $Q_A$ and $Q_C$ of the emitter follower connection are respectively connected to the base electrodes of transistors $Q_{13}$ and $Q_{14}$ of the PNP type transistor pair $Q_B$ of the emitter follower connection for deriving out a modulated signal from the commonly connected emitter electrodes of the transistors $Q_{13}$ and $Q_{14}$ of the PNP type transistor pair $Q_B$.

Figure 4:
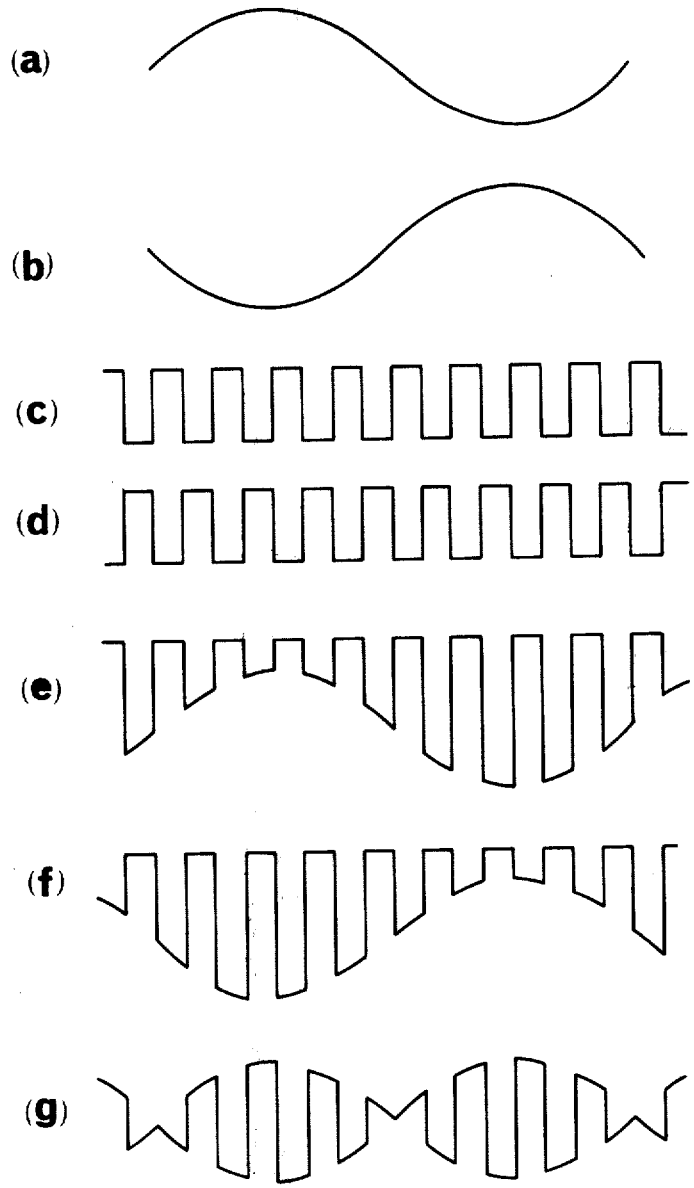
FIG. 4 illustrates in sections (a) to (g) wave forms at various portions useful to explain the operation of the embodiment shown in FIG. 3.

FIG. 4 shows waveforms at various points of the circuit wherein the waveform of a modulation signal supplied to the input terminal $IN_{11}$ is shown in section (a), and the waveform of a modulation signal applied to the input terminal $IN_{12}$ is shown in section (b). As can be noted, the polarities or phases of both input modulation signals are opposite to each other. The waveforms of the signals to be modulated and applied to the base electrodes of transistors $Q_{12}$ and $Q_{16}$ of the NPN type transistor pairs $Q_A$ and $Q_C$ of the emitter follower connection are shown in sections (c) and (d). As shown, these signals to be modulated have opposite phases. The waveform of the emitter voltage of the transistors $Q_{11}$ and $Q_{12}$ of the NPN type transistor pair $Q_A$ of the emitter follower connection is shown in section (e), the waveform of the emitter voltage of transistors $Q_{15}$ and $Q_{16}$ of the NPN type transistor pair $Q_C$ of the emitter follower connection in section (f), and the waveform of the emitter voltage of transistors $Q_{13}$ and $Q_{14}$ of the PNP type transistor pair $Q_B$ of the emitter follower connection in section (g).

The operation of the embodiment shown in FIG. 3 will now be described with reference to FIG. 4. The modulation input signals having waveforms as shown in FIG. 4 at (a) and (b) are applied to input terminals $IN_{11}$ and $IN_{12}$ respectively and then applied to the base electrodes of transistors $Q_{11}$ and $Q_{15}$ respectively to cause them to operate in an emitter follower scheme. On the other hand, since a suitable DC voltage is being applied to the base electrode of transistor $Q_{17}$ of the differential amplifier COMP from the source of bias voltage E, the input signal to be modulated applied to the base electrode of transistor $Q_{18}$ via input terminal $IN_{13}$ is switched by the transistor $Q_{18}$ so that signals to be modulated which have opposite polarities will appear on the collector electrodes of transistors $Q_{17}$ and $Q_{18}$ as shown in FIG. 4 at (c) and (d). Then, these signals to be modulated are transmitted to the respective base electrodes of transistors $Q_{13}$ and $Q_{14}$ via transistors $Q_{12}$ and $Q_{16}$ of the emitter follower connection. At this time, transistors $Q_{11}$, $Q_{12}$ and $Q_{15}$, $Q_{16}$ operate like OR gate circuits. More particularly, these circuits operate in such a manner that higher one of the base voltages is transmitted to the commonly connected emitter electrodes producing an output therefrom as shown in FIG. 4 at (e) or (f). At the common emitter of transistors $Q_{13}$ and $Q_{14}$, the wave forms shown in FIG. 4 at (e) and (f) are mixed to produce a modulated output signal as shown in FIG. 4 at (g).

As described above, since the modulator circuit is constructed such that the modulation signals applied to the input terminals $IN_{11}$ and $IN_{12}$ are transmitted through transistors $Q_{11}$, $Q_{15}$ and transistors $Q_{13}$, $Q_{14}$ of emitter follower circuits for the production of the modulated signal, the linearity of the circuit is excellent and the dynamic range thereof which is determined by the levels of the signals to be modulated shown in FIG. 4 at (c) and (d) can be extended. It should be understood that the voltage supplied to the modulator circuit shown in FIG. 3 may be higher than the level of the input modulation signals shown in FIG. 4 at (a) and (b) so long as the input voltage is contained in the operating range of the differential amplifier COMP constituted by transistors $Q_{17}$ and $Q_{18}$ and acting as an amplifier for the signals to be modulated. This ensures that the modulator of this invention can operate with a low source voltage.

Although the invention has been described in terms of a phase inverting amplifier for the signals to be modulated, it should be understood that the invention is not limited to such a specific construction. Thus, for example, signals to be modulated may be supplied to the base electrodes of transistors $Q_{12}$ and $Q_{16}$ of the NPN type transistor pairs $Q_A$ and $Q_C$ of the emitter follower connection after passing through a phase inversion circuit of a transistor logic (TTL), that is, a logic circuit utilizing transistors at the input and output. In this case, a sufficiently wide dynamic range may be ensured even when the voltage supplied to the modulator circuit is equal to the low voltage supplied to the TTL circuit. Furthermore, while in the foregoing embodiment, emitter follower type NPN transistor pairs $Q_A$ and $Q_C$ with the emitter electrodes of the transistors commonly connected and an emitter follower type PNP transistor pair $Q_B$ with the emitter electrodes of the transistors of the pair commonly connected were used, it will be clear that the invention is by no means limited to such specific connection and that the NPN type transistor pair and the PNP type transistor pair may be interchanged. More particularly, the same object can be attained even when the emitter follow type NPN transistor pairs $Q_A$ and $Q_C$ with their emitter electrodes commonly connected are substituted by PNP type transistor pairs or when the emitter follower type PNP transistor pair $Q_B$ with their emitter electrodes commonly connected is substituted by an NPN type transistor pair. In this case, the polarity of the source should be reversed.

As can be noted from the foregoing description, the invention provides a novel modulation system capable of providing sufficiently wide dynamic range with low operating voltage and with a relatively simple circuit construction. For this reason, the novel modulator system can be advantageously applied to modulation circuit of a portable color television camera driven by a battery of low voltage.

What is claimed is:

1. A modulator system comprising:

emitter follower type first and second transistor pairs, emitter electrodes of the transistors of each pair being commonly connected, said first and second transistor pairs each having transistors of one conductivity type;

an emitter follower type third transistor pair, emitter electrodes of the transistors of the third pair being commonly connected, said third pair having transistors of one conductivity type, which conductivity type is opposite to that of the transistors in said first and second transistor pairs;

means for supplying clamped modulation signals to base electrodes of first transistors of said first and second transistors pairs, said modulation signals being of opposite polarity;

means for supplying signals to be modulated to base electrodes of second transistors of said first and second transistors pairs, said signals being of opposite polarity; and means for connecting base electrodes of the first and second transistors of said third transistor pair to the commonly connected emitter electrodes of said first and second transistor pairs, thereby producing a modulated output signal from said commonly connected emitter electrodes of said third transistor pair.

* * * * *